United States Patent
Tsai et al.

(12) 
(10) Patent No.: US 6,472,335 B1
(45) Date of Patent: Oct. 29, 2002

(54) METHODS OF ADHESION PROMOTER BETWEEN LOW-K LAYER AND UNDERLYING INSULATING LAYER

(75) Inventors: Chia-Shiung Tsai, Hsin-chu (TW); Yao-Yi Cheng, Taipei (TW); Hun-Jan Tao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/175,019

(22) Filed: Oct. 19, 1998

(51) Int. Cl.[7] .............................................. H01L 21/31
(52) U.S. Cl. .................. 438/780; 438/763; 438/786; 438/906; 438/958; 438/964
(58) Field of Search ................ 438/624, 665, 438/756, 757, 786, 906, 958, 964, 763, 780

(56) References Cited

U.S. PATENT DOCUMENTS

| | | | |
|---|---|---|---|
| 4,744,858 A | * 5/1988 | McDavid et al. | 156/643 |
| 5,373,180 A | * 12/1994 | Hillenius | 257/357 |
| 5,482,894 A | 1/1996 | Havemann | 437/195 |
| 5,489,553 A | * 2/1996 | Chen | 438/624 |
| 5,494,858 A | 2/1996 | Gnade et al. | 437/231 |
| 5,556,806 A | * 9/1996 | Pan et al. | 437/195 |
| 5,559,055 A | 9/1996 | Chang et al. | 437/195 |
| 5,561,318 A | 10/1996 | Gnade et al. | 257/638 |
| 5,599,746 A | * 2/1997 | Lur et al. | 438/655 |
| 5,627,403 A | 5/1997 | Bacchetta et al. | 257/639 |
| 5,635,423 A | * 6/1997 | Huang et al. | 438/638 |
| 5,658,994 A | 8/1997 | Burgoyne, Jr. et al. | 525/390 |
| 5,705,232 A | 1/1998 | Hwang et al. | 427/512 |
| 5,708,303 A | 1/1998 | Jeng | 257/758 |
| 5,723,383 A | 3/1998 | Kosugi et al. | 438/719 |
| 5,731,243 A | * 3/1998 | Peng et al. | 438/612 |
| 5,744,391 A | * 4/1998 | Chen | 438/264 |
| 5,759,906 A | 6/1998 | Lou | 438/623 |
| 5,767,582 A | 6/1998 | Lee et al. | 257/753 |
| 6,046,115 A | * 4/2000 | Molloy et al. | 438/710 |
| 6,121,495 A | * 9/2000 | Babb | 568/17 |
| 6,143,646 A | * 11/2000 | Wetzel | 438/637 |
| 6,207,583 B1 | * 3/2001 | Dunne et al. | 438/725 |
| 6,235,693 B1 | * 5/2001 | Cheng et al. | 510/175 |
| 6,288,188 B1 | * 9/2001 | Godschalx | 526/285 |

OTHER PUBLICATIONS

Wolf et al., "Silicon Processing for the VLSI Era, vol. 1", Lattice Press, 1986, pp. 183, 192.*

* cited by examiner

Primary Examiner—Carl Whitehead, Jr.
Assistant Examiner—Jeff Vockrodt
(74) Attorney, Agent, or Firm—George O. Saile; Stephen B Ackerman; William J. Stoffel

(57) ABSTRACT

The present invention provides a method improving the adhesion between inter metal dielectric (IMD) layers by performing a HF dip etch to treat the surface of an oxide, silicon nitride or Silicon oxynitride insulating layer before an overlying low-K layer is formed. The present invention provides a method of fabricating a low-K IMD layer 20 over an oxide, Silicon oxynitride (SiON), or nitride IMD layer 14 with improved adhesion. First, a 1st inter metal dielectric (IMD) layer 14 is formed over a substrate. Next, the invention's novel HF dip etch is performed on the 1st IMD layer 14 to form a treated surface 16. Next, a 2nd BMD layer composed of a low-K material is formed over the rough surface 16 of the 1st IMD layer 14. The treated surface 16 improves the adhesion between a 1st IMD layer oxide (oxide, SiN or SiON) and a low k layer. Subsequent photoresist strip steps do not cause the 1st IMI layer 14 and the 2nd IMD layer 20 (low-K dielectric) to peel.

1 Claim, 2 Drawing Sheets

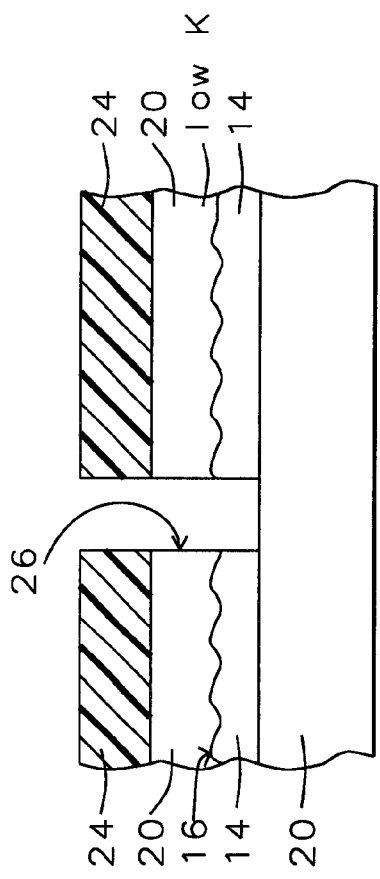
FIG. 1
FIG. 2
FIG. 3
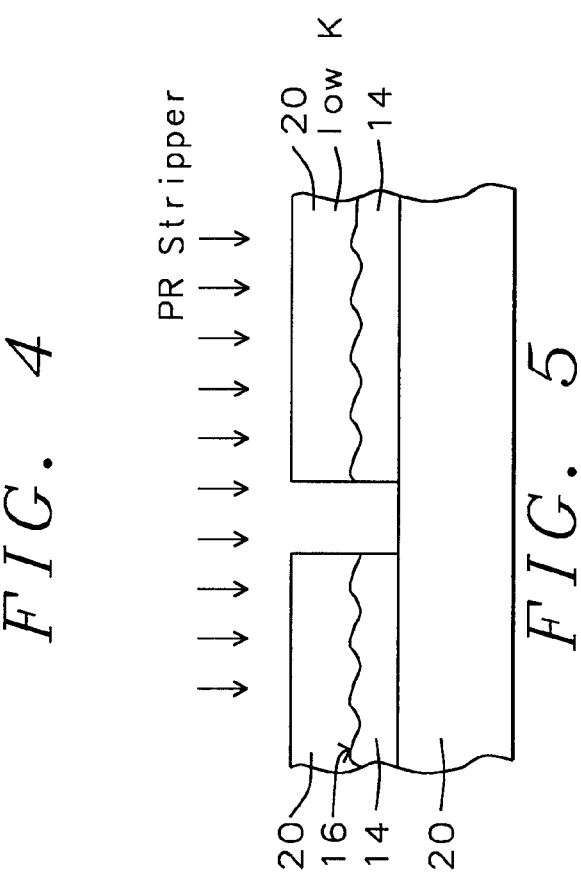
FIG. 4
FIG. 5

METHODS OF ADHESION PROMOTER BETWEEN LOW-K LAYER AND UNDERLYING INSULATING LAYER

BACKGROUND OF THE INVENTION

1) Field of the Invention

This invention relates generally to method for forming dielectric layers in a semiconductor device, more particularly to a method for improving the adhesion between inter metal dielectric (IMD) layers and more particularly to a HF dip etch to roughen the surface of an Oxide, SiN or SiON layer before an overlying low-K layer is formed.

2) Description of the Prior Art

To improve the RC delay in deep submicron technology, semiconductor manufactures need to implement low k (k value <3.0) dielectric materials and Cu interconnect materials. The inventors have found that dual damascene etching with low K materials has many challenges including low k profile control in etching and adhesion between underlying oxide layer (inter metal dielectric layer) and the overlying low k dielectric layer during photoresist polymer wet strip. Severe oxide dielectric layer peeling problems will induce the metal bridge after Cu chemical-mechanical polish and particles on wafers. This leads to shorting between Cu lines and other yield problems.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,482,894(Haveman) that shows a method of forming low-K dielectrics and an overlaying hard mask.

U.S. Pat. No. 5,708,303 (Jeng) shows a IDL method using Low-k materials and oxide layers.

U.S. Pat. No. 5,705,232(Hwang) shows a method of forming low-K dielectrics and an overlaying hard mask 34.

U.S. Pat. No. 5,561,318(Gnade et al) & U.S. Pat. No. 5,494,858(Gnade et al.) show a low-K dielectric between metal lines.

U.S. Pat. No. 5,723,383(Kosugi et al.) shows a H plasma treatment of a substrate surface.

U.S. Pat. No. 5,627,403(Bacchetta) shows an oxide adhesion layer (2) over a dielectric layer (4).

U.S. Pat. No. 5,767,582(Lee et al) shows an insulating layer treatment.

U.S. Pat. No. 5,658,994(Burgoyne, Jr. et al.) shows a PAE dielectric formula.

U.S. Pat. No. 5,759,906(Lou) and U.S. Pat. No. 5,559,055(Chang et al.) show examples of low-K dielectrics that can be used in the invention.

SUMMARY OF THE INVENTION

It is an objective of the present invention to provide a method for improving the adhesion between an underlying insulating layer (e.g., oxide, silicon nitride, SACVD) and an overlying low-K dielectric layer (e.g., Flare, PAE-2, FOX).

It is an objective of the present invention to provide a method for improving the adhesion between an underlying insulating layer (e.g., oxide, silicon nitride, Silicon oxynitride, SACVD) and an overlying low-K dielectric layer (e.g., Flare, PAE-2, FOX) by performing a HF dip etch on the insulating layer to roughen and improve the surface of the insulating layer.

It is an object of the present invention to provide a method for fabricating a inter metal dielectric (IMD) layer for a semiconductor device that do not peel when subjected to a photoresist strip.

It is an object of the present invention to provide a method for improving the adhesion between inter metal dielectric (IMD) layers and overlying Low-K dielectric layers between adjacent metal lines.

It is an object of the present invention to provide a method for to improving the adhesion between inter metal dielectric (IMD) layers by performing a HF dip etch to roughen the surface 14 of an Oxide, SiN or SiON insulating layer 14 before an overlying low-K layer 20 is formed.

To accomplish the above objectives and other objectives, the present invention provides a method improving the adhesion between inter metal dielectric (IMD) layers by performing a HF dip etch to prepare the surface of an Oxide, SiN or SiON insulating layer before a low-K dielectric layer is formed thereover. The present invention provides a method of fabricating a low-K IMD layer 20 over an oxide or nitride IMD layer 14 with improved adhesion. The invention's HF dip etch improves the adhesion between a 1st insulating layer 114 (oxide, SiN or SiON) and a low k dielectric layer 116 by preparing (e.g., roughening) the 1st insulating layer surface 16. See FIG. 6.

First, a first insulating (e.g., IMD) layer 14 is formed over a substrate. See FIGS. 1 to 5. Next, the invention's HF dip etch is performed on the 1st insulating layer 14 to form a treated surface 16. Next, a second insulating layer 20 composed of a low-K material is formed over the prepared (e.g., rough) surface 16 of the first insulating layer 14. The rough surface 16 improves the adhesion between a first insulating layer oxide (oxide, SiN or SiON) and a overlying low k dielectric layer by preparing the first roughening layer surface 16. When subsequent photoresist etch and strip operations are performed (FIGS. 4 & 5), the first insulating layer and 2nd insulating layer do not peel in subsequent photoresist strip processes.

Summary table: COMPOSITIONS OF THE LAYERS

| layer | preferred composition | alternate composition |
| --- | --- | --- |
| 1st insulating layer 14 | $SiO_2$ | Silicon oxynitride or SiN |
| 2nd insulating layer (low-K) | Low-K material (eg, Flare) | PAE2, SILK, poly(arlene ether) |

BENEFITS

The invention provides the following benefits:

the invention improves the adhesion between a oxide, SiN or SiON insulating layer 14 and an overlying low-K layer 20 between roughen the surface 16 of the layer 14 by a HF dip etch.

The present invention achieves these benefits in the context of known process technology. However, a further understanding of the nature and advantages of the present invention may be realized by reference to the latter portions of the specification and attached drawings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTIONS OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 5 are cross sectional views for illustrating a method for a HF dip etch of a 1st IMD layer to improve the adhesion to overlying low K layer 20 according to the present invention.

DETAILED DESCRIPTION OF THE PREFERRED EMBODIMENTS

Figure 6:
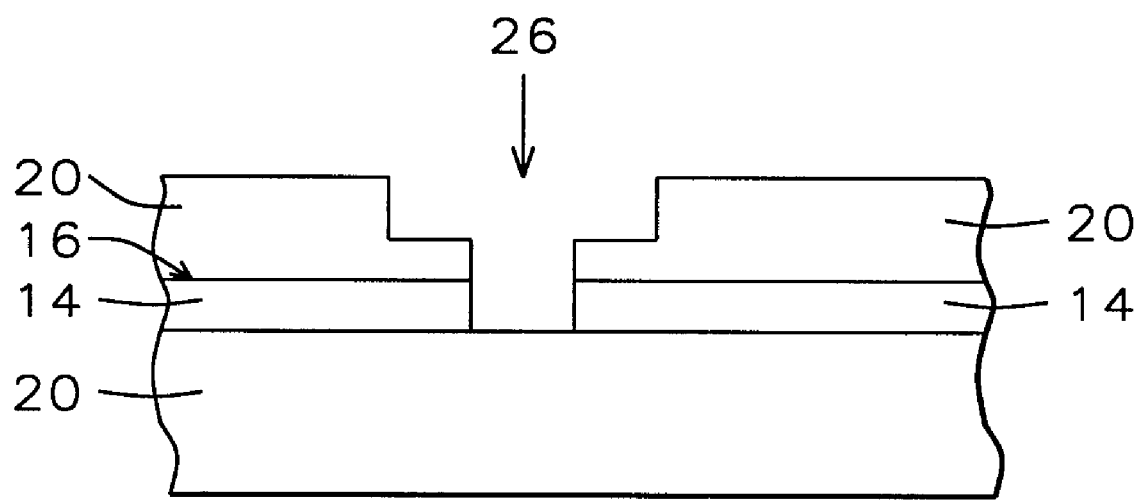
FIG. 6 is an example of a configuration of $1^{st}$ and $2^{nd}$ insulating layers in a dual damascene structure.

The present invention will be described in detail with reference to the accompanying drawings. The present invention provides a method of fabricating a low-K IMD layer 20 over an oxide, silicon oxynitride, or nitride first insulating layer 14 with improved adhesion. The invention HF dip etch improves the adhesion between a 1st insulating layer (oxide, SiN or SiON) and a low k layer by preparing the $1^{st}$ insulating (e.g., inter metal dielectric IMD) layer surface 16.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

The preferred composition of the layers are the invention are shown below with all important parameters.

TABLE

Important parameters for the invention.

| Process step/ layer | preferred composition | alternate compositions |
|---|---|---|
| 1st insulating layer 14 | SiO$_2$ | Silicon oxynitride or SiN |
| KEY-HF ETCH | HF | BOE |
| 2nd insulating layer (low-K dielectric) | Low-K material (e.g., Flare) | PAE2, SilK, |

FIGS. 1 through 5 show a simplified configuration $1^{st}$ and $2^{nd}$ insulating layers 14 16. The actual configuration of the $1^{st}$ and $2^{nd}$ insulating layers can vary and include any combination and configuration of dielectric layers below, on the same level or above conducive layer (such as interlevel dielectric (IDL) layers and inter metal dielectric (IMD) layers).

FIG. 1 shows the step of forming a first insulating layer 14 over a semiconductor structure 10. Substrate 10 is understood to possibly include a semiconductor wafer, active and passive devices formed within the wafer and (insulating and conductive) layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Note, the term "inter metal dielectric (IMD) layer" as used in this patent application is a term of art meaning any dielectric layers formed (vertically or horizontally) between two conductive layers (e.g., metal layers, metal lines, metal interconnects, etc.) in a semiconductor device.

The first insulating layer 20 can be composed of: silicon oxide, silicon oxide preferably formed by plasma enhanced chemical vapor deposition (PECVD), silicon oxide formed preferably by PE-TEOS, silicon nitride, Silicon oxynitride, silicon oxide preferably formed by sub atmospheric chemical vapor deposition (SACVD). The first insulating layer 20 can comprise more than one insulating layer as long as the top layer or layer in contact with the low-k dielectric layer is composed of silicon oxide, silicon oxynitride or silicon nitride. E.g., See FIGS. 6 and 7.

Key Step—Treating the $1^{ST}$ Insulating Layer with HF

FIG. 2 shows the step of dip etching the first insulating layer 14 in 50:1 HF in H$_2$O time in a range of between about 30 and 90 seconds (tgt=60 sec) to form a rough surface 16 of the first insulating layer 14.

Alternately, the dip etching the first insulating layer can use buffered oxide etch (BOE) 50:1 for a time in a range of between about 30 and 90 seconds (tgt=60 sec) to form a rough surface 16 of the first IMD layer 14. The invention's dip etch is performed for a time sufficient to condition the $1^{st}$ insulating layer surface 16.

During the course of experimentation, it was unexpectedly found the treatment of the $1^{st}$ insulating layer 14 surface 16 with a HF etchant somehow improved the adhesion with an overlying low k layer 20. The invention's dip etch of the first insulating layer provided an unexpected result—the improved adhesion between the $1^{st}$ and $2^{nd}$ insulating layers particularly when subjected to photoresist strips. The invention's dip etch improved device yields by reducing the particle contamination from oxide peeling and metal particles from CMP processes (from damascene processes).

FIG. 3 shows the step of forming a second insulating (IMD) layer 20 on the rough surface 16 of the first insulating (IMD) layer 20. The 1st insulating (IMD) layer 14 and the second insulating (IMD) layer 20 preferably should not absorb the same solvent from the photoresist striper to improve the adhesion between the $1^{st}$ and $2^{nd}$ IMD layers 14 20. The solvent content is easy to get in interphase.

The second IMD layer 20 is preferably composed of low k materials such as: silicon oxide, and commercial preparations such as:

Flare model No 20 made by Allied Signal company, USA, (poly (arlene ether), PAE-2, made by Shumacher Co. company address USA, (poly (arlene ether based)), SilK by Dow Corning, Co., USA. (poly (arlene ether based)), FOX, made by Dow Corning Co., Midland Mich., USA. (comprised of hydrogen silsesquioane), low K-MSQ (See U.S. Pat. No. 5,370,904(Mine et al.) that shows a method for forming a low-K organic IMD layer silicon oxide ceramic curing low K-MSQ (hydrogen silsequioxane resin).), SiOF-CVD-flourine doped glass (FSG), and SiOC-CVD.

U.S. Pat. No. 5,759,906 (Lou) and U.S. Pat. No. 5,559,055(Chang et al.) describe other organic and inorganic low-k dielectric materials that are suitable for the second insulating layer.

The second insulating layer is preferably formed form a low k dielectric comprised of (poly (arlene) ether—i.e., PAE) such as Flare model No 20 made by Allied Signal company, USA, (poly (arlene ether)), PAE-2, made by Shumacher Co. company address USA, (poly (arlene ether)) or SilK by Dow Coming, Co., USA. (poly (arlene ether)).

FIG. 4 shows the step of forming a photoresist layer 24 over the second insulating layer.

Openings 24 are etched in the second insulating layer 20 and the first insulating layer 14 by using the photoresist layer 24 as an etch mask.

FIG. 5 shows the step of wet stripping the photoresist layer using a photoresist stripper (PSR) whereby because of the conditioned/roughened surface 16, the second IMD layer 20 adheres to the first IMD layer 14 without peeling.

The photoresist stripper can be ACT 690 (by Ashland chemicals, Columbas, Ohio, USA, ACGT 935, and EKC 265. The inventor has found that most resist stripper and polymer removes contain chemicals that adhere easily to the interphase of the low-K layer and the $1^{st}$ insulating layer. Therefore most photoresist can cause the peeling problem that the invention solves.

After the invention's HF etch of the $1^{st}$ IMD layer, the second IMD layer 20 adheres to the first IMD layer 14 without peeling.

FIG. 6 shows an example of a dual damascene configuration. A first insualting layer 14 is formed over a substrate 10. The invention's HF surface treatment is performed to form the treated surface 16. Next, a low-K dielectric layer 20 is formed thereover, Photo steps are performed to form the opening 26. Photo strippers are used to remove the photoresist and polymers from the opening 26. The opening is filled with a conductive material, preferably with copper plug and chemical-mechanical polished. The Cu damascene process is very sensitive to contamination and flaking. Harsh strippers and polymer removers must be used that cause insulating layers to delaminate. The invention allows the use of these stripers and increases the adhesion between insulating layers.

EXAMPLES/EXPERIMENTS

The following non-limiting examples represent preferred forms and best modes contemplated by the inventor for practice of his invention, as well as illustrating the results obtained through its use.

The inventors performed the following experiment to document the improvements in adhesion of an underlying Silicon oxynitride layer 14 to an overlying low-K layer 20 when the invention's HF dip etch treatment is used to roughen the surface 16 of the insulating layer 14. FIGS. 1 thru 5 illustrate the major steps of the experiment.

FIG. 1 shows the formation of a silicon oxynitride layer 14 on a substrate 10.

FIG. 2 shows the treating of the layer 14 with 4 different treatments (using 4 different sets of sample wafers). The 4 different treatments are shown below in the table.

FIG. 3 shows the formation of the low-k layer 20 (Flare). The thickness of the low-k layer 20 is measured now before the low-k layer is exposed to the photoresist stripper and polymer remover. The thickness was measured by a NANO 8000 machine.

FIG. 4 shows a photoresist layer 24 is formed on the low-K layer 20. A via hole 26 is etched in the low-k layer 200.

FIG. 5 shows a photoresist stripper (ACT 690C–115° C., 30 min dip). Next, the Flare layer 20 thickness is measured again.

The results of the experiment are shown in the table below.

TABLE

Experimental results

| SiON film treatments | flare 20 thickness measurement before ACT690C dip | flare layer 20 thickness measurement after ACT690C dip | Net Flare layer 20 thickness loss |
|---|---|---|---|
| (1) N20 plasma 2 | 22107 + −6.77% | 18573 + −9.3% (failure) | 3534 |
| (2) Invention's HF | 21714 + −10.9% | 21147 + −13.2% (ok) | 567 |
| (3) NH40H dip | 22856 + −14.5% | 18886 + −S.1% (failure) | 3970 |
| (4) HMDS | 22267 + −16.8% | 19791 + −33.7% (failure) | 2476 |

The table above shows that the invention's HF dip treatment removed less Flare than any other treatment. The other treatments (1, 3, & 4) thickness reduction show that the low-K Flare 20 delaminated. This delamination causes yeild losses, contamination and shorts in product devices.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a low-K second insulating layer over first insulating layer with improved adhesion, comprising the steps of:
   a) forming a first insulating layer over a semiconductor structure; said first insulating layer composed of Silicon oxynitride; said first insulating layer having a surface;
   b) treating said first insulating layer with HF under conditions sufficient to alter the condition of said surface thereby increasing the adhesion between said first insulating layer and a subsequently formed second insulating layer composed of a low-K dielectric material; treating said first insulating layer includes dip etching said first insulating layer in 50:1 HF in $H_2O$ for a time in a range of between about 30 and 90 seconds to form a treated surface of said first insulating layer;
   c) forming said second insulating layer on said surface of said first insulating layer; said second insulating layer is comprised of poly(arlene ether);
   d) forming a photoresist layer over said second insulating layer;
   e) etching openings in said second insulating layer and said first insulating layer by using said photoresist layer as an etch mask; said openings are dual damascene openings; and
   f) wet stripping said photoresist layer using a photoresist stripper whereby said second insulating layer adheres to said first insulating layer without peeling; said photoresist stripper is comprised of: hydroxyl amine, 2-(2-aminoethoyy) ethanol, cathechol and an alkaline buffer.

\* \* \* \* \*